United States Patent [19]
Kobayashi

[11] Patent Number: 6,069,534
[45] Date of Patent: *May 30, 2000

[54] BALANCE PHOTO-RECEIVER WITH COMPLEMENTARY HBT COMMON-BASE PUSH PULL PRE-AMPLIFIER

[75] Inventor: Kevin W. Kobayashi, Torrance, Calif.

[73] Assignee: TRW Inc., Redondo Beach, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/985,488

[22] Filed: Dec. 4, 1997

[51] Int. Cl.[7] ........................................................ H03F 3/08
[52] U.S. Cl. ........................ 330/308; 330/263; 250/214 A
[58] Field of Search .............................. 330/308, 59, 110, 330/311, 263; 250/214 A, 359, 189

[56] References Cited

U.S. PATENT DOCUMENTS

| | | | |
|---|---|---|---|
| 2,782,267 | 2/1957 | Beck | 179/171 |
| 4,374,363 | 2/1983 | Previti | 330/263 |
| 4,540,952 | 9/1985 | Williams | 330/279 |
| 5,398,004 | 3/1995 | Kobayaski | |
| 5,565,672 | 10/1996 | Siegel et al. | 250/214 R |
| 5,742,046 | 4/1998 | Reele | 250/214 A |

OTHER PUBLICATIONS

"High Sensitivity Optically Preamplified Direct Detection DPSK Receiver with Active Delay–Line Stabilization" by E. Swanson, J. Livas and R. Bondurant, iie. *Phototonics Technical Letter*, vol. 6, No. 2, Feb., 1994, pp. 263–265.

"Push–Pull Amplifier Stages Quell Receiver Intermodulation Problems" by H. Sopotta, *Microwaves and RF*, Nov. 1994, pp. 5–8.

"Analysis of Design of Analog Integrated Circuits", by P. Gray and R. Meyer, second edition, John Wiley & Sons New York, 1984, pp. 176–180. No Month.

Primary Examiner—Benny Lee
Assistant Examiner—Henry Choe
Attorney, Agent, or Firm—Michael S. Yatsko

[57] ABSTRACT

A balanced photoreceiver which includes one or more photodiodes coupled to an amplifier that includes a common base configured input stage which operates over a frequency band from DC to millimeter wave frequencies. In one embodiment of the invention, the amplifier is formed as a three-stage direct coupled amplifier which includes a direct coupled complementary common base configured input stage, a complementary common emitter configured Darlington pair intermediate stage and a complementary common collector configured output stage. The common collector configured output stage is used to recombine the complementary current outputs from the input and intermediate stages. The photoreceiver in accordance with the present invention provides relatively superior output waveform symmetry over an increasing power input.

2 Claims, 15 Drawing Sheets

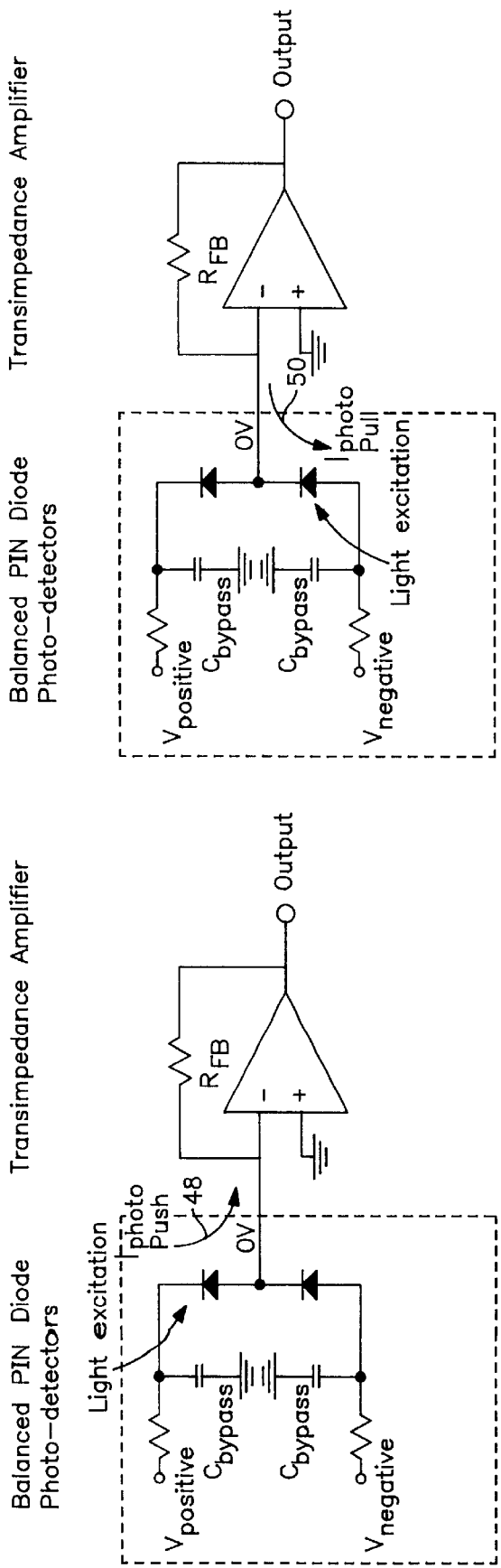

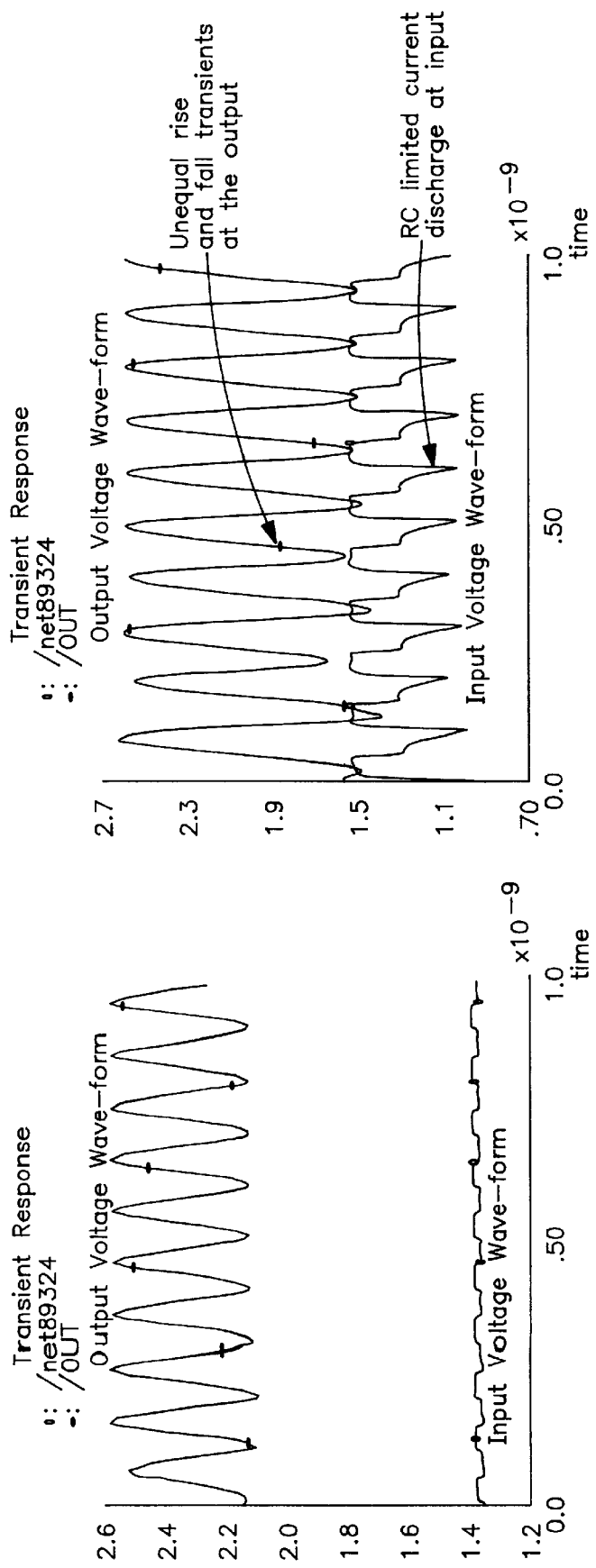

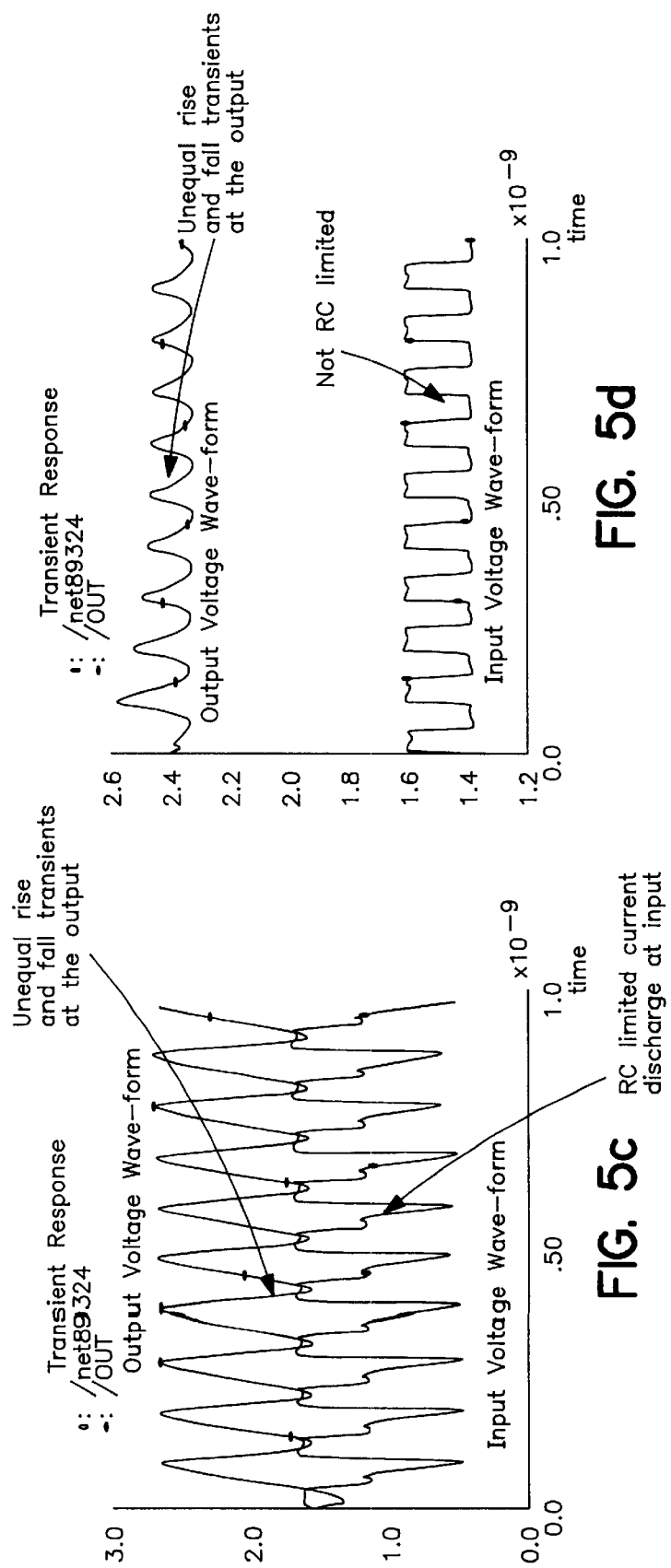

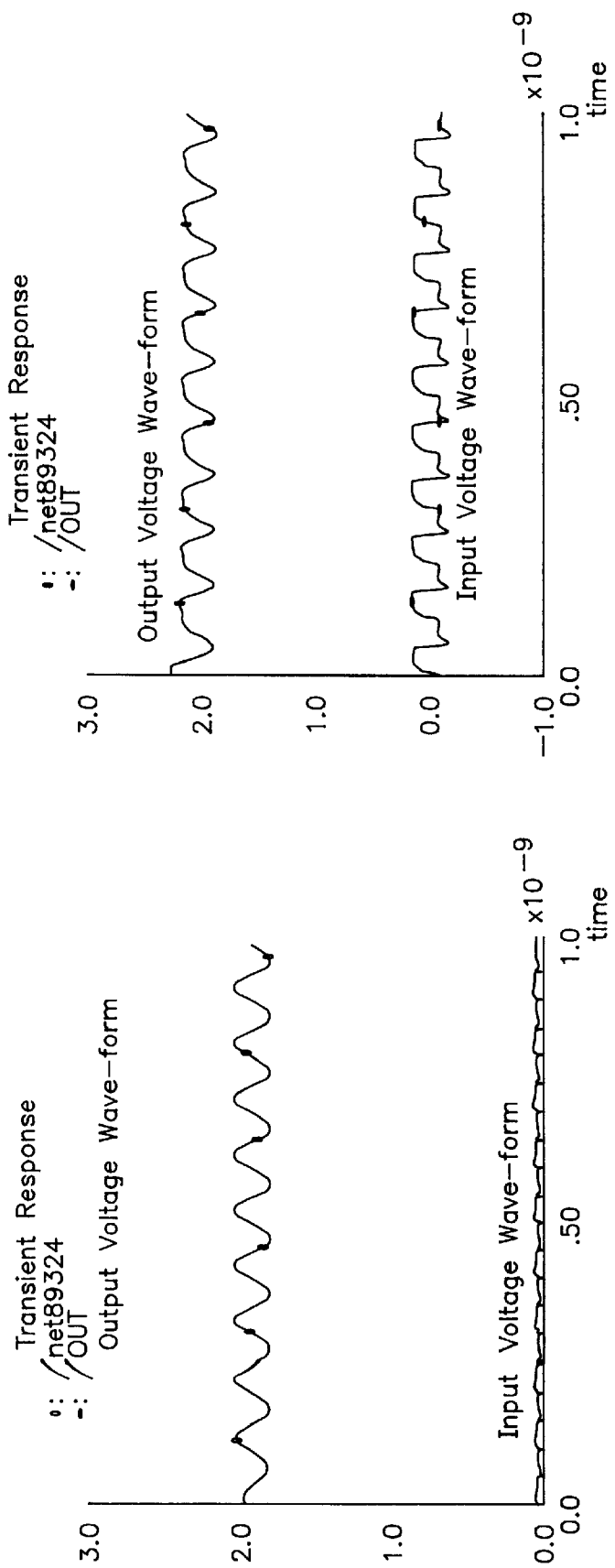

BALANCE PHOTO-RECEIVER WITH COMPLEMENTARY HBT COMMON-BASE PUSH PULL PRE-AMPLIFIER

BACKGROUND OF THE INVENTION

1. Field of the Invention

The present invention relates to a balanced photoreceiver and more particularly to a balanced photoreceiver which includes one or more photodiodes directly coupled to an amplifier having a common base input stage which can operate over a frequency band from DC to millimeter wave frequencies with superior output waveform symmetry and relatively low noise performance which can be monolithically integrated to form a balanced receiver monolithic microwave integrated circuit (MMIC).

2. Description of the Prior Art

Balanced photoreceivers for use in, for example, high-data rate communication systems, such as satellite communications, are known. Such balanced photoreceivers are known to be configured for differential phase shift keying (DPSK) which provides increased sensitivity over conventional, single-ended on-off keying photoreceiver topologies. An example of such a balanced photoreceiver is illustrated in FIG. 1. As shown in FIG. 1, the photoreceiver, generally identified with the reference numeral 20, includes a pair of photodiodes 22, 24 and a transimpedance amplifier 26, coupled to the photodiodes 22, and 24 by way of an AC coupling capacitor 28. In such a balanced photoreceiver 20, a phase modulated optical signal from an optical transmitter is optically pre-amplified and demodulated using a MachZehnder interferometer which outputs two complementary optical signals, as generally discussed in: "High Sensitivity Optically Pre-Amplified Direct Detection DPSK Receiver With Active Delay Line Stabilization", by E. Swanson, J. Livas and R. Bondurant, *Photonics Technical Letter*, vol. 6, No. 2, February 1994, pp. 263–265, hereby incorporated by reference. The two complementary output signals from the MachZehnder interferometer are independently detected by the photodiodes 22 and 24, whose polarities are configured such that if one photodiode 22, 24 is optically excited, it will produce a photocurrent in a direction such that a transimpedance amplifiers 26 output voltage will produce a high voltage level, and if the other photodiode 22, 24 is excited, it will produce a photocurrent in the opposite direction such that the amplifiers output voltage will produce a low-voltage level as indicated by the arrows, identified with the reference numerals 30 and 32. In this manner, the data rate at which the signal to noise ratio (S/N) of the photoreceiver 20 is adequate will be dependent on the ability of the transimpedance amplifier 26 to push and pull current in and out of its input through the photodiodes 22 and 24, which, in turn, is dependent on the magnitude of photocurrent induced in the photodetectors 22 and 24. Because of the high shot noise produced by the photodiodes 22 and 24, the photoreceiver 20 normally requires a large amount of optical gain in front of the photodiodes 22, 24 and a correspondingly high optical power in order to reduce the noise contributions of the photodiodes 22 and 24 as well as the transimpedance amplifier 26. Unfortunately, known transimpedance amplifier circuit topologies have common emitter or common-source inputs and cannot equally source and sink current at the same rate without incurring significant degregation to the input waveform, especially at high optical power levels which results in degregation of the bit error rate of the photoreceiver 20. Thus, in order to achieve a relatively high data rate, the photodiodes 22, 24 are AC coupled to a 50 Ω shunt resistor, connected between a common node 34 between the photodiodes 22, 24 and ground, for providing a means for sourcing and sinking the optical induced photocurrents of the photodiodes 22 and 24.

There are several disadvantages of the photoreceiver 20 illustrated in FIG. 1. For example, the 50 Ω DC shunt resistor 36 used to sink and source the modulated photocurrents induced by the photodiodes 22 and 24, adds substantial noise, for example, 18 pA/sqrt (Hz). In addition, the AC coupling capacitor 28 inhibits DC biased modulation of the transimpedance amplifier 26 which causes the low frequency response of the photoreceiver 20 to be limited by the size of the AC coupling capacitor used. In many known systems, the AC coupling capacitor is substantially large in value which consequently prevents the entire photoreceiver 20 from being monolithically integrated in a self-contained microwave monolithic integrated circuit (MMIC). In order to eliminate such problem, direct coupled DPSK receivers have been developed. An example of such a direct coupled DPSK receiver is described and illustrated in "High Sensitivity Optically Pre-Amplified Direct Detection DPSK Receiver With Active Delay Line Stabilization", supra and illustrated in FIGS. 2a.

The direct coupled photoreceiver illustrated in FIG. 2a, generally identified with the reference numeral 40, includes a pair of balanced photodiodes 42, 44 and a transimpedance amplifier 46, configured for push pull operation. FIGS. 2b and 2c illustrate the push/pull operation of the receiver 40 in response to light excitation as indicated by the arrows 48 and 50. A schematic representation of the transimpedance amplifier 46 is illustrated in FIG. 3 and described in detail in U.S. Pat. No. 5,398,004, assigned to the same assignee as the assignee of the present invention and hereby incorporated by reference.

As shown in FIG. 3, the transimpedance amplifier 46 includes a common emitter configured input transistor $Q_1$. For such a common emitter input transistor, an equivalent input voltage of 18 mV causes the output of the common emitter transistor $Q_1$ to be compressed in gain by 1 dB, set by the inherent physics of the transistor which means that the input of the common emitter transistor cannot handle much current or voltage swing. Beyond the linear input power, voltage and current ranges, the transimpedance amplifier 46 has unequal charge and discharge characteristics which results in asymmetric rise and fall times of the output waveform at high speeds and thus overall effective bandwidth degregation, limited by the slower of the charging mechanisms and evident degregation of the BER (system bit error rate) of the received data stream, especially for higher incident power levels, as illustrated in FIGS. 4a, 4b, 5a, 5b, and 5c.

FIG. 4a and 4b represent graphical illustrations of the wideband output power and input impedance response of the common emitter configured input transimpedance amplifier 46 over an increasingly stepped input power level delivered from a 50 Ω source. As shown in FIG. 4a, the output power of the transimpedance amplifier 46 is nearly saturated, even at a relatively low input power −20 dBm; unacceptable for many known optically preamplified DPSK direct detection receiver applications which normally operate between −15 dBm and +5 dBm of incident optical power. FIG. 4a also reflects poor gain or output power flatness that is heavily dependant on input power level. For example, at −20 dBm input power, the output response is flat at low frequency and then begins a well-behaved roll-off response, typical of a small signal amplifier. However, at an input power level of −5 dBm, the output power starts out actually lower that the −20 dBm response and peaks up above 10 GHz where the output power has a more gradual roll off with frequency, indicative of the response of a non-linear driven amplifier. FIG. 4b illustrates that as input power is increased, the input impedance dramatically increases. Such a characteristic presents a detrimental effect of the bandwidth of the photoreceiver, whose source impedance is normally very large and can be modeled by a small shunt capacitor which makes a dominant pole with the input impedance of the transimpedance amplifier 46.

FIGS. 5a, 5b and 5c illustrate the signal distortion as a function of increased power levels. In particular, FIGS. 5a, 5b and 5c illustrate the transient response of the common emitter configured transimpedance amplifier 46 to a 10 GHz current pulse generator for increasing pulse amplitudes of 0.2 milliamps (mA), 2.0 mA and 4.0 mA, respectively. At a low current input pulse amplitude of 0.2 mA as illustrated in FIG. 5a, the input voltage maintains its square wave-shaped form and the output maintains a symmetrical sine-wave shape. As the current pulse amplitude is increased to 2.0 mA and 4.0 mA, as illustrated in FIGS. 5b and 5c, respectively, the input voltage waveform begins to distort. In particular, the input voltage waveform demonstrates an RC slewing characteristic on the falling edge when the base of the input common emitter transistor is discharging. However, there is no evidence of an RC slewing characteristic on the rising edge, which creates an asymmetry in the rise and fall waveform characteristics due to the different charging and discharge characteristic of the base, consistent with conventional bipolar theory. The slow discharging of the base to bring the transistor out of saturation is slow due to the removal of minority carrier base charge storage which must recombine in a base bulk before the voltage can follow the input waveform. The corresponding output voltage waveform also exhibits asymmetric rise and fall times as dwell times, which would propagate into jitter noise. The characteristics discussed above are typical characteristics of an overdriven amplifier, an inherent problem for conventional common emitter transimpedance amplifier topologies.

The RC slewing characteristics of the input voltage can be suppressed using a 50 Ω input resistor, but at the expense of added thermal noise. However, the output waveform is still limited in frequency response at high input levels. In particular, FIG. 5d illustrates the transient response of a common emitter transimpedance amplifier which utilizes a 50 Ω shunt resistor to accommodate the large push pull current and is also AC coupled to the photodiodes. As shown in FIG. 5d, although the input waveform exhibits a well-defined square wave, the output waveform still shows unequal rise and fall times as well as general asymmetry, which limits the amplifiers latter stages, which cannot take the large signal levels amplified by the high gain common emitter input stage. As such, high gain common emitter input stage must be followed by an amplifier which can accept a large signal without being driven into saturation.

SUMMARY OF THE INVENTION

It is an object of the present invention to solve various problems of the prior art.

It is another object of the present invention to provide a photoreceiver which can operate over a frequency band from DC to millimeter wave frequencies.

It is yet another object of the present invention to provide a photoreceiver which provides relatively superior output waveform symmetry with increasing power input.

It is yet another object of the present invention to provide a photoreceiver with relatively low noise performance.

It is yet a further object of the present invention to provide a photoreceiver which can be monolithically integrated to form a balanced receiver monolithic microwave integrated circuit (MMIC).

Briefly the present invention relates to a balanced photoreceiver which includes one or more photodiodes, coupled to an amplifier that includes a common base configured input stage which operates over a frequency band from DC to millimeter wave frequencies. In one embodiment of the invention, the amplifier is formed as a three-stage direct coupled amplifier which includes a direct coupled complementary common base configured input stage, a complementary common emitter configured Darlington pair intermediate stage and a complementary common collector configured output stage. The common collector configured output stage is used to recombine the complementary current outputs from the input and intermediate stages. The photoreceiver in accordance with the present invention provides relatively superior output waveform symmetry over an increasing power input.

DESCRIPTION OF THE DRAWINGS

These and other objects of the present invention are readily understood wits reference to the following specification and attached drawing wherein:

FIGS. 2b and 2c are block diagrams of the conventional direct coupled balanced photoreceiver illustrated in FIG. 2a, showing the push pull current paths required from the balanced photodiodes.

FIGS. 5a–5c illustrate the transient response of the transimpedance amplifier illustrated in FIG. 3 to a 10 GHz of current pulse generator in response to increasing pulse amplitudes of 0.2 mA, 2.0 mA and 4.0 mA, respectively.

FIG. 5d is a graphical illustration illustrating the response of a transimpedance amplifier similar to the transimpedance illustrated in FIG. 3 but with AC coupling to the photodiodes and a 50 Ω DC shunt resistor, to a 10 GHz current pulse generator at 2 mA.

FIGS. 8a–8d are graphical illustrations illustrating the transient response of the common base input transimpedance amplifier illustrated in FIG. 6 to a 10 GHz current pulse generator for increasing pulse amplitudes of 0.2 mA, 1.0 mA, and 2.0 mA, respectively.

DETAILED DESCRIPTION

The present invention relates to a balanced photoreceiver topology which in one embodiment includes a transimpedance amplifier with a common base complementary input stage which has relatively low impedance, low input noise and is directly coupled to the photodiodes. The balanced photoreceiver in accordance with the present invention enables the balanced photoreceiver to operate over a frequency band from DC to millimeter wavelengths and provides for superior output waveform symmetry with increasing input power and relatively low noise performance. Moreover, the topology of the balanced photoreceiver in accordance with the present invention is adapted to be monolithically integrated to form a self-contained balanced photoreceiver monolithic microwave integrated circuit (MMIC).

Figure 1:
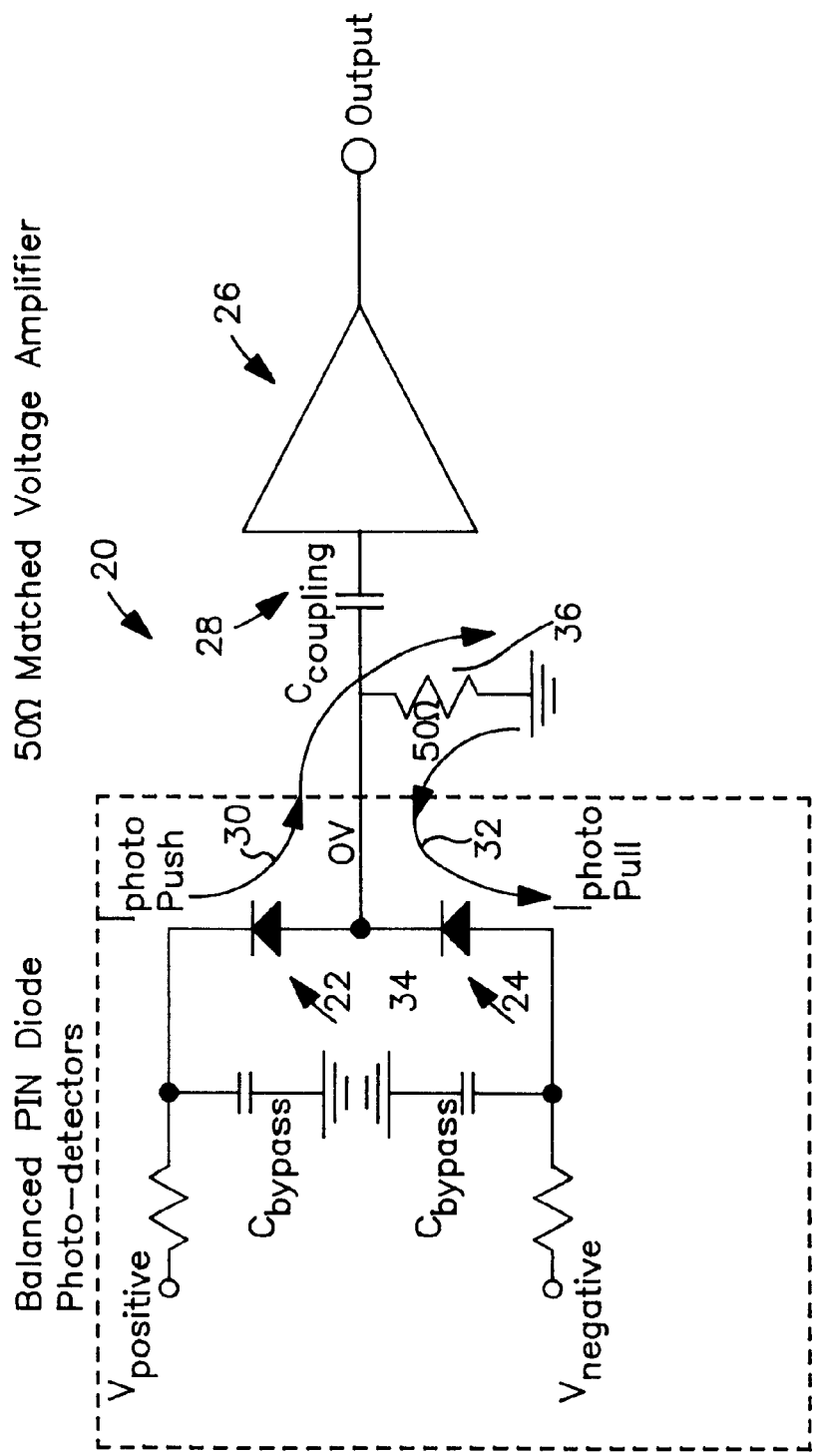
FIG. 1 is a schematic diagram of a conventional AC coupled balanced photoreceiver.
Figure 2A:
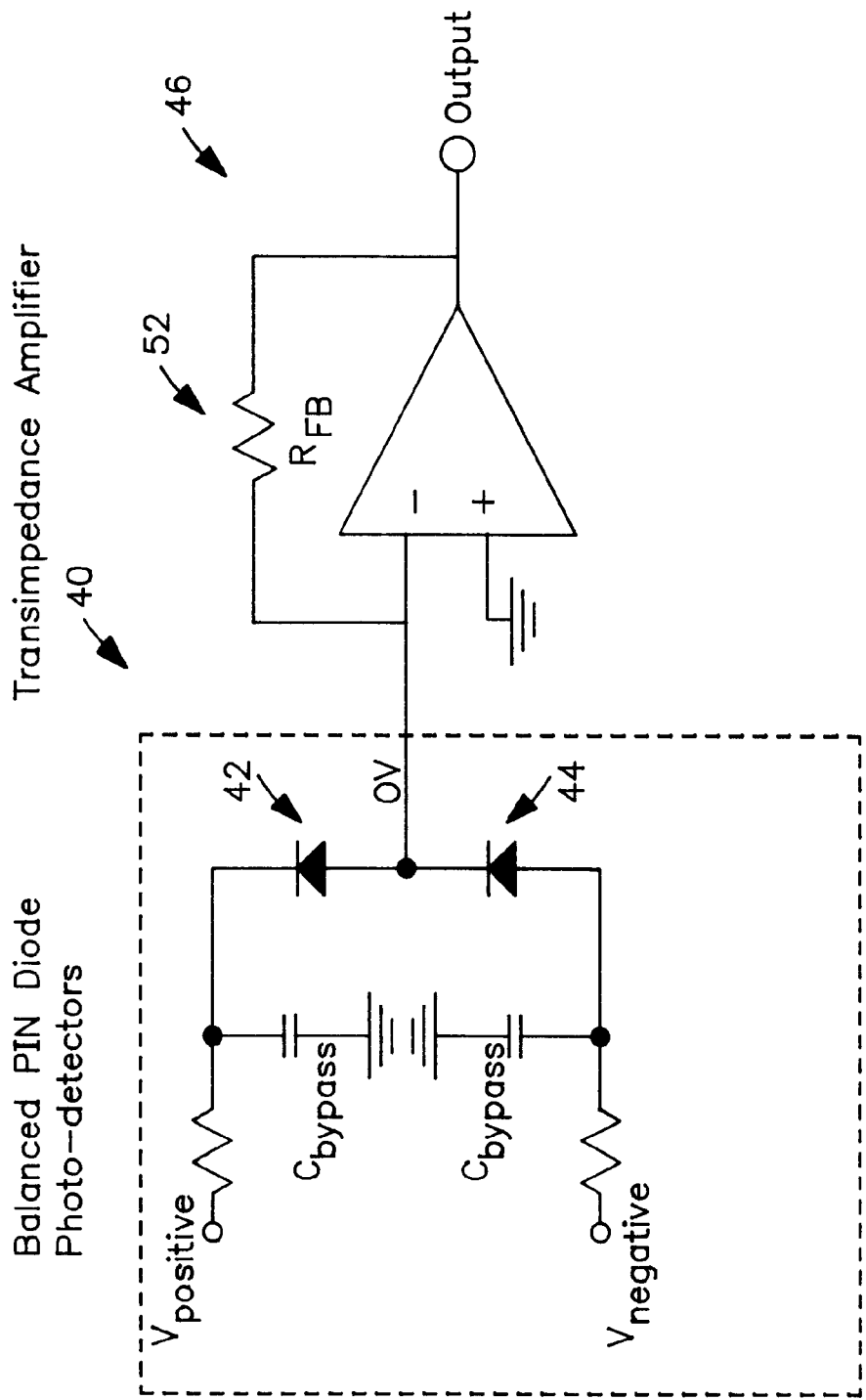
FIG. 2a is a block diagram of a conventional direct coupled balanced photoreceiver.
Figure 3:
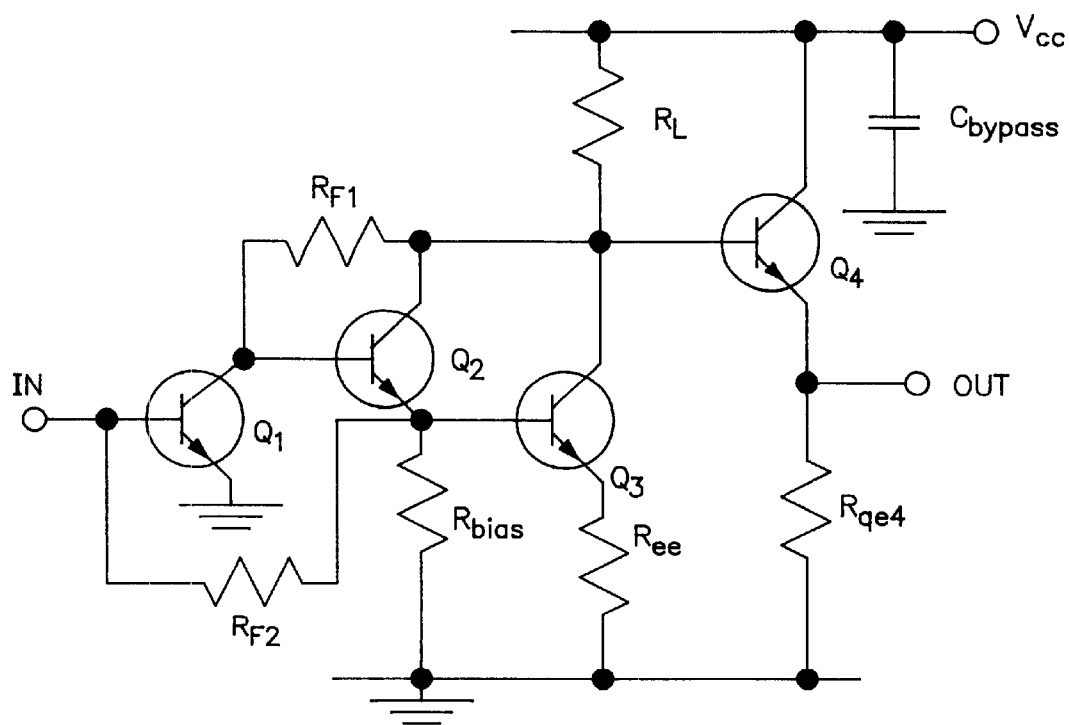
FIG. 3 is a schematic diagram of a known common emitter input transimpedance amplifier with a common emitter input stage.
Figure 4A:
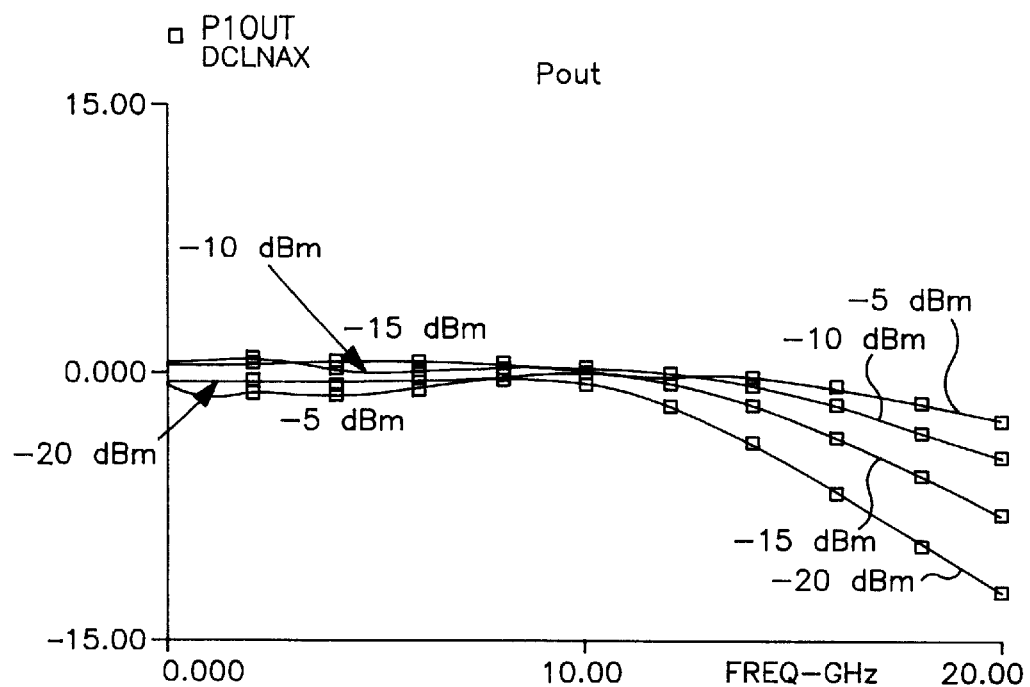
FIG. 4a is a graphical illustration illustrating the output power $P_{out}$ of the conventional common emitter input transimpedance amplifier illustrated in FIG. 3 as a function of frequency in GHz over an increasingly stepped input power level from a 50 Ω source.
Figure 4B:
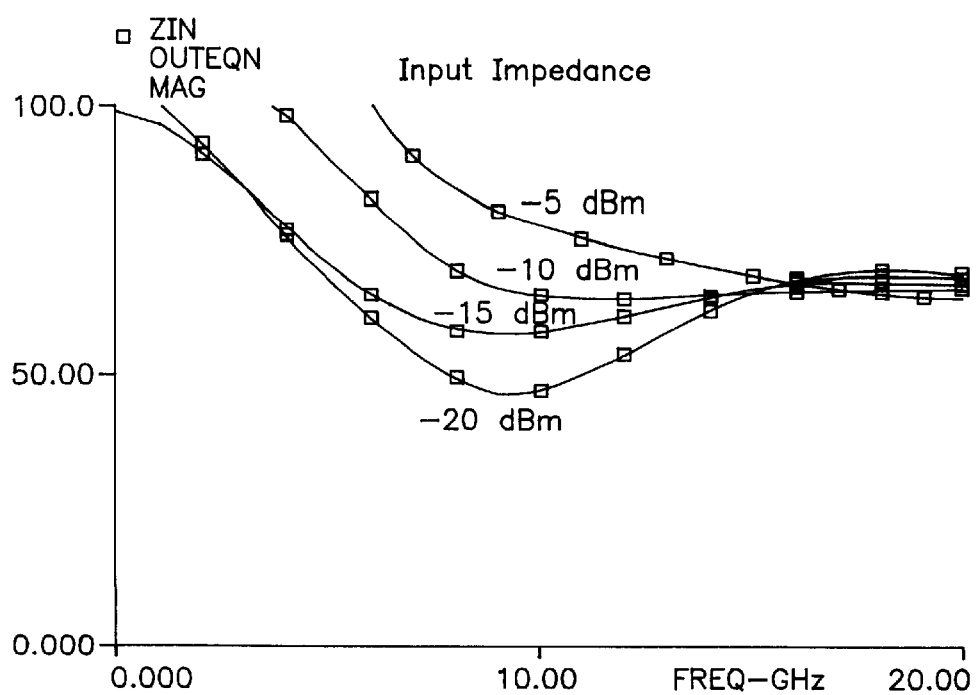
FIG. 4b is a graphical illustration illustrating the input impedance of the transimpedance amplifier illustrated in FIG. 3 as a function of frequency in GHz over an increasingly stepped input power level delivered from a 50 Ω source.
Figure 6:
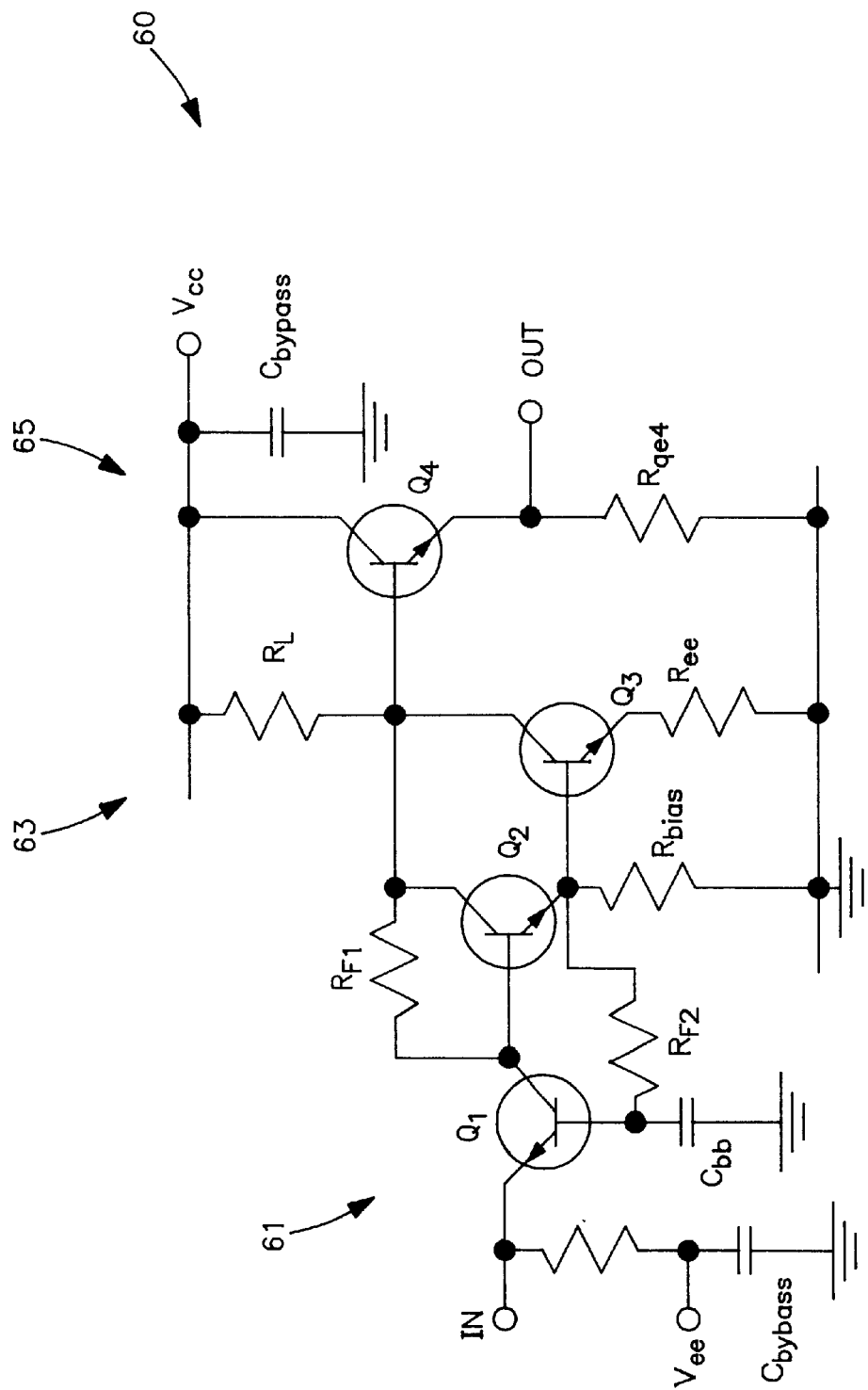
FIG. 6 is a schematic diagram of a single ended common base input transimpedance amplifier in accordance with one embodiment of the invention.

As discussed above, there are many disadvantages in utilizing a transimpedance amplifier with a common emitter based input stage. In order to eliminate the disadvantages of such a transimpedance amplifier with a common emitter input stage, transimpedance amplifiers with a common base input stage are utilized in accordance with one aspect of the invention. Common base amplifiers are discussed in "Push-Pull Amplifier Stages Quell Receiver Intermodulation Problems", by H. Sopotta, *Microwaves and RF*, November 1994, pp. 5–8; and "*Analysis of Design of Analog Integrated Circuits*", by P. Gray and R. Meyer, second edition, John Wiley & Sons New York, 1984, pp. 176–180, hereby incorporated by reference. Such common base amplifiers do not have a large voltage gain when driven by a high impedance and thus allow the amplifier to accept higher input power. In addition, the input in such an amplifier can be set to a low impedance, typically less sensitive to a large signal modulation. A transimpedance amplifier with a common base input stage is illustrated in FIG. 6 and generally identified with the reference numeral 60. The amplifier 60 includes a single ended common base configured input stage 61, a single ended common emitter configured intermediate stage 63, formed from a Darlington pair, and a single ended output stage 65 connected in a common emitter configuration. The common base input stage 61 includes a common base configured transistor $Q_1$, which can be obtained from the common emitter configured transimpedance amplifier illustrated in FIG. 3 by connecting the emitter to the input transistor $Q_1$ through the input and grounding the base through a relatively large bypass capacitor $C_{bypass}$. The transimpedance amplifier 60 also incorporates a bias resistor and a negative supply voltage in order to set the quiescent emitter bias current of the common base transistor $Q_1$.

Figure 7A:
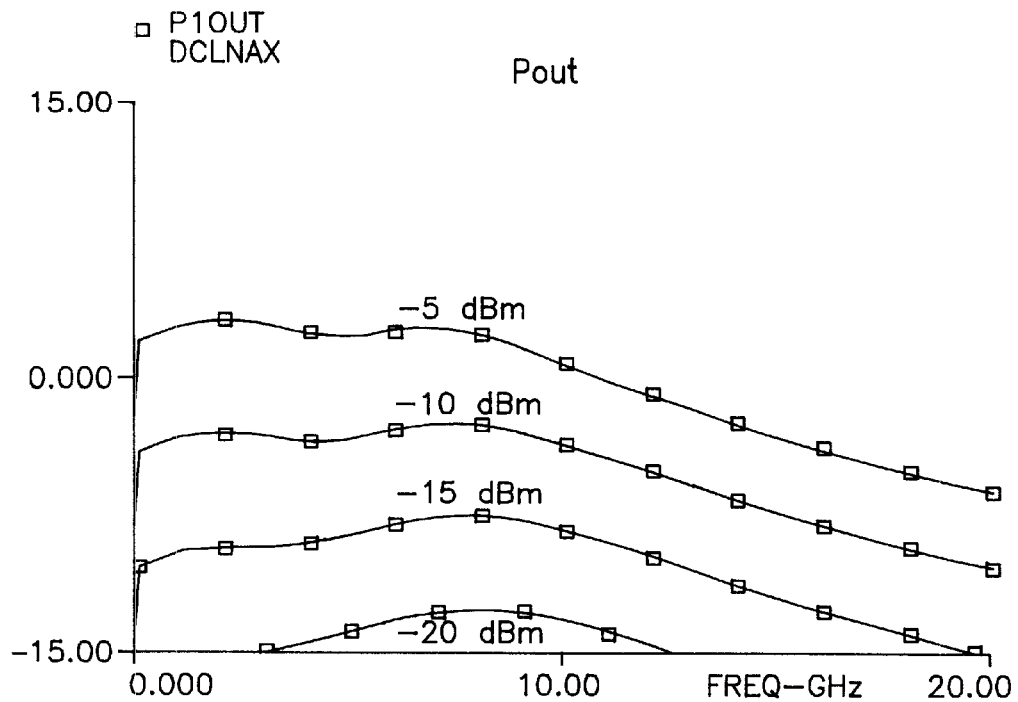
FIG. 7a and 7b are graphical illustrations illustrating output power $P_{out}$ and input impedance response of the single-ended common base input transimpedance amplifier illustrated in FIG. 6 over an increasingly stepped power level delivered from a 50 Ω source.
Figure 7B:
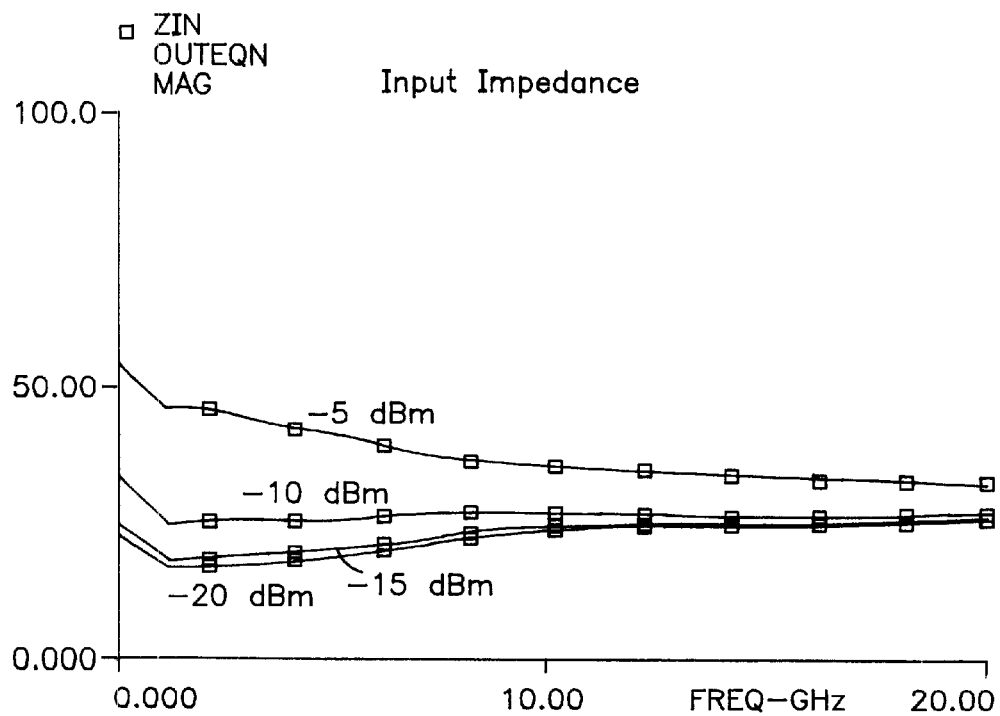

FIGS. 7a and 7b illustrate the wideband output power and input impedance response of the transimpedance amplifier 60 over an increasingly stepped input power level delivered by a 50 Ω source. As illustrated in FIG. 7a, the output power of the transimpedance amplifier 60 steadily increases with input power and does not change its wideband gain flatness shape, unlike the common emitter input configured transimpedance amplifier discussed above. FIG. 7b illustrates that the wideband input impedance response of the transimpedance amplifier 60 has a relatively low impedance of approximately 20–30 Ω which is relatively flat across the frequency band and input power up to 10 dBm. At −5 dBm input power, the input impedance at lower frequencies begins to increase slightly. Compared to the input impedance power dependence of the common emitter configured transimpedance amplifier discussed above, the common base configured transimpedance amplifier 60 achieves a much more well-behaved input impedance response and it is likely to preserve the bandwidth response of the integrated balance photoreceiver.

Figure 8D:
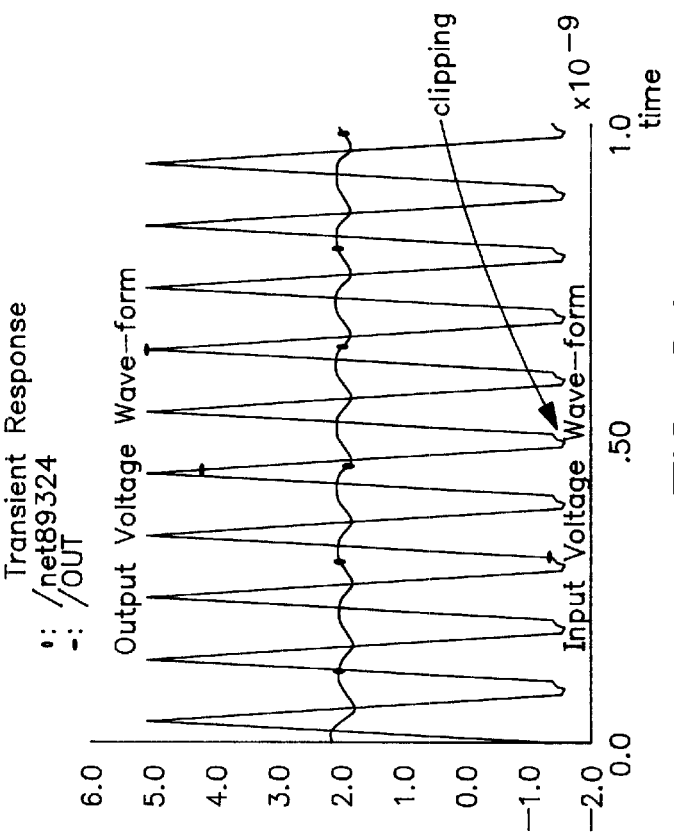
Figure 8C:
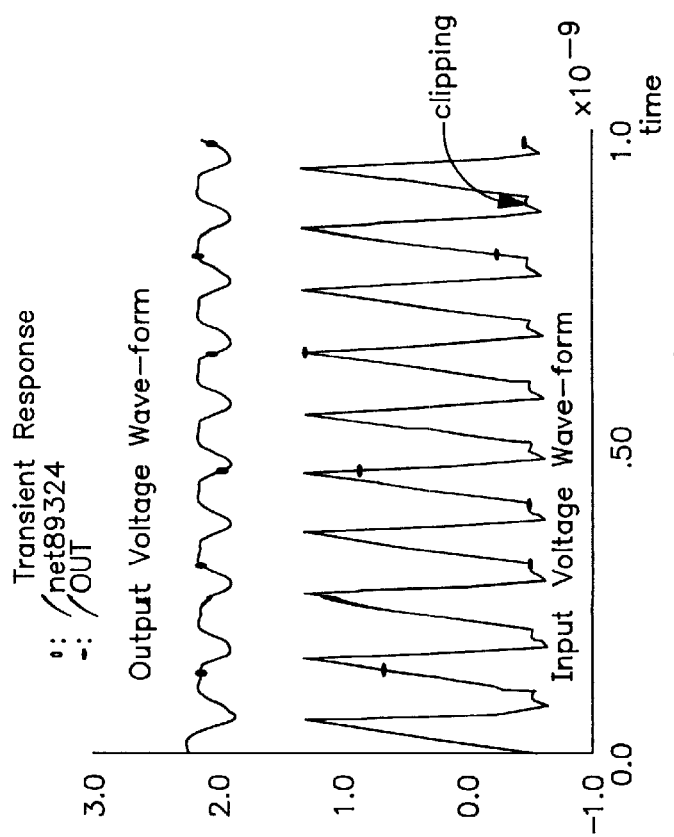

FIGS. 8a–8d illustrate the transient response of the transimpedance amplifier 60 to a 10 GHz current pulse generator for increasing pulse amplitudes of 0.2 mA, 1.0 mA, 2.0 mA and 4.0 mA, respectively. As shown in FIG. 8a, at a low input current pulse amplitude of 0.2 mA, the input voltage maintains its square wave shape form and the output waveform maintains a symmetrical sign wave shape. As the input current pulse amplitude is increased to 1.0 mA, 2.0 mA, 3.0 mA as illustrated in FIGS. 8b, 8c and 8d, respectively, the input voltage waveform begins to distort. Unlike the transimpedance amplifier with a common emitter input stage as discussed above, the input voltage waveform of the transimpedance amplifier 60 does not exhibit any pronounced RC slewing on the falling or rising edge of the input waveform due to the wider linear input power range, which is common for common-base configured transistors. The corresponding output voltage waveforms do exhibit asymmetric saturated waveform characteristic as the input current pulse amplitude is increased. However, the output voltage waveform does exhibit fairly equal rise and fall times; a characteristic of the push-pull current capability of the common based input.

Figure 9:
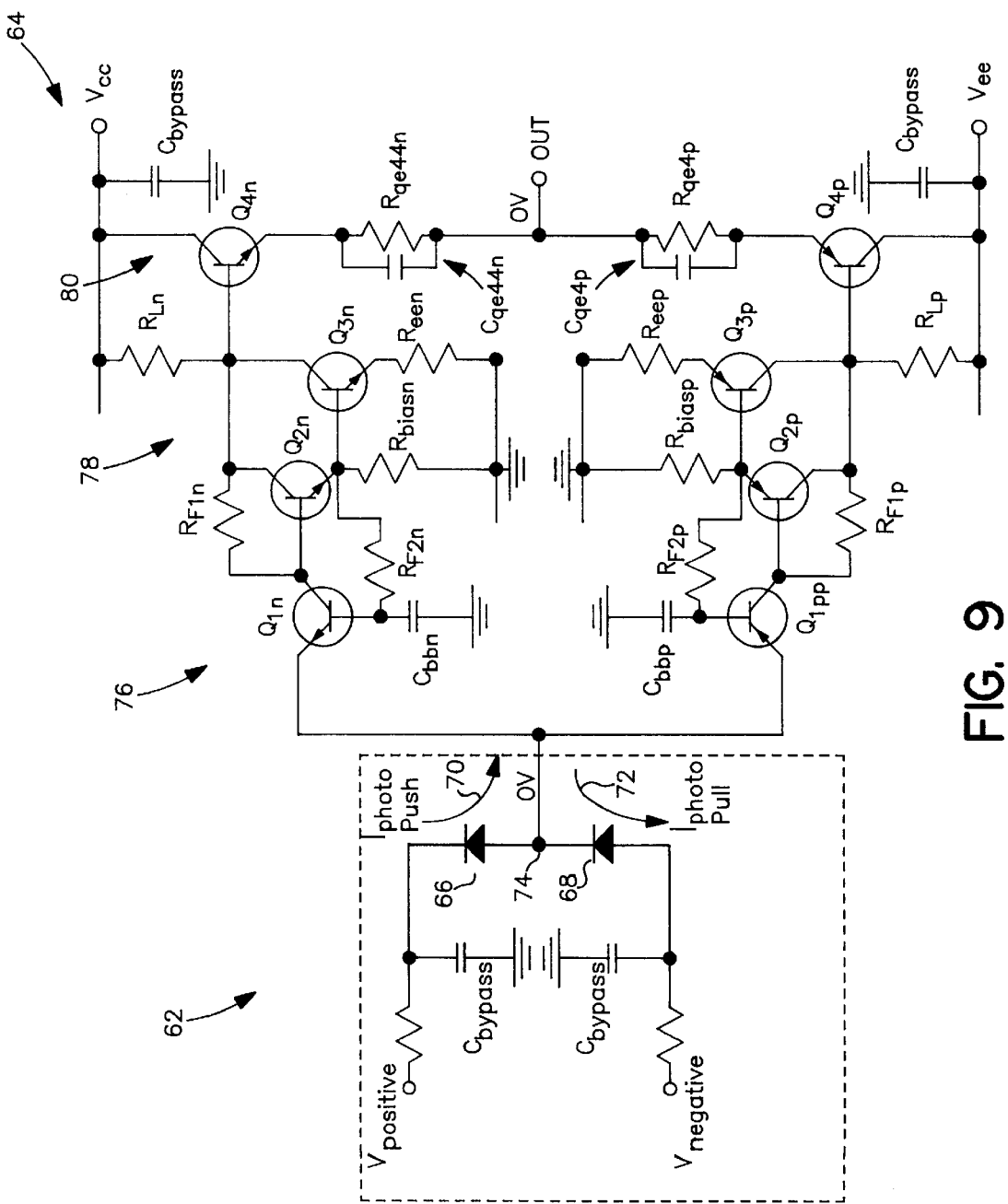
FIG. 9 is a schematic diagram of a balanced photoreceiver in accordance with an alternate embodiment of the present invention.

The shortcomings discussed above of the single-ended common base configured transimpedance amplifier 60 can be improved by way of a complementary common base push pull input stage and a complementary push pull output stage as illustrated in FIG. 9 and discussed below. More particularly, FIG. 9 illustrates an alternate embodiment of the transimpedance amplifier 60 that is directly coupled to a pair of photodiodes forming a balanced photoreceiver 62 in accordance with the present invention. The balance photoreceiver 62 includes an improved transimpedance amplifier 64 and a pair of photodiodes 66 and 68. As discussed above, the photodiodes 66 and 68 are configured with polarities such that when the photodetector 66 is optically excited, a photocurrent will be produced as indicated by the arrow 70. Alternatively, excitation of the photodiode 68 causes current to be pulled from the transimpedance amplifier 64 in the direction of the arrow 72. As shown, the two photodiodes 66, 68 are connected at a node 74, which, in turn, is directly coupled to a transimpedance amplifier 64. By utilizing direct coupling, the response of the photoreceiver 62 is operational over a frequency band from DC to millimeter wave frequencies. Moreover, as discussed above balance photoreceivers have heretofore not been known to be integrated on a common MMIC because of the size of the AC coupling capacitor. By providing direct coupling, thereby eliminating the AC coupling capacitor, the balanced photoreceiver 62 in accordance with the present invention is adapted to be integrated in a self-contained (MMIC).

The transimpedance amplifier 64 is formed as a three-stage amplifier which includes a complementary common base configured input stage 76, a complementary common emitter configured intermediate stage 78 formed with a Darlington pair and a complementary common collector configured output stage 80. The output stage 80 is used to recombine the complementary current outputs from the input and intermediate stages 76 and 78. The topology of the transimpedance amplifier 64 obviates the elimination of the 50 Ω DC shunt resistor which improves the noise performance of the amplifier. By eliminating the 50 Ω shunt resistor, the transimpedance amplifier 64 will operate with superior noise performance relative to known balanced photoreceivers.

Figure 10A:
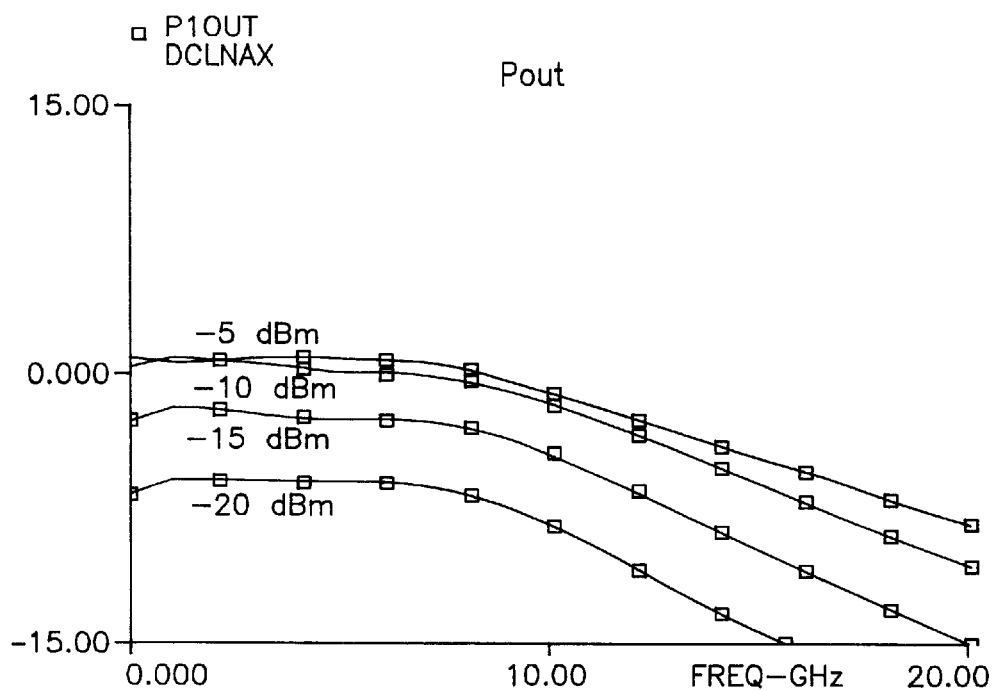
FIGS. 10a–10b are graphical illustrations illustrating the output power and input impedance response of the complementary common base input transimpedance amplifier illustrated in FIG. 9 over an increasingly stepped input power level delivered from a 50 Ω source.
Figure 10B:
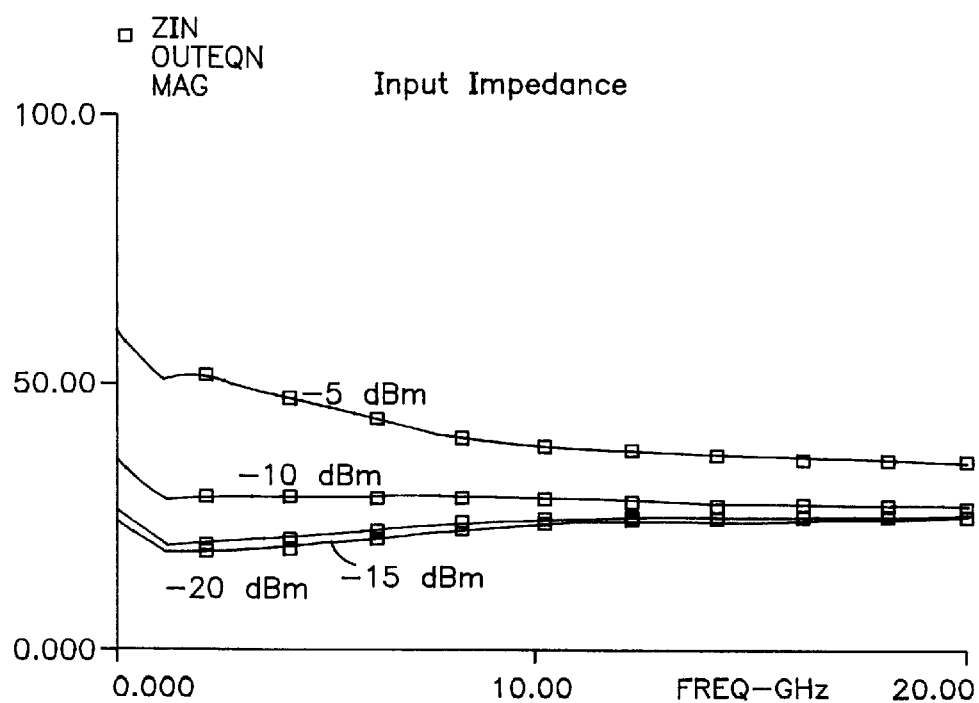

FIGS. 10a and 10b illustrate the wideband output power and input impedance response respectively as a function of frequency for the transimpedance amplifier 64 in accordance with the present invention over an increasingly stepped input power level delivered from a 50 Ω source. As illustrated in FIG. 10a, the output power of the transimpedance amplifier 64 steadily increases with increasing input power and does not change its wideband gain flatness shape, unlike the conventional common emitter transimpedance amplifier discussed above. FIG. 10b illustrates that the wideband input and impedance response as a function of input power for the transimpedance power 64. As shown in FIG. 10b, the input impedance is relatively steady, i.e. ≈20–30 Ω, independent of the frequency and input power up to −10 dBm. At −5 dBm input power the input transimpedance amplifier 64 at the lower frequencies begins to increase slightly. Compared to the transimpedance amplifier with a common emitter configured input stage discussed above, the transimpedance amplifier 64 with the complementary common base configured input stage achieves a much more well-behaved impedance response and is likely to preserve the bandwidth response of the integrated photoreceiver 62. Compared to the single ended common base configured transimpedance amplifier discussed above in connection with FIG. 6, the complementary common base configured transimpedance amplifier 64 in accordance with the present invention shows similar output power frequency flatness and input impedance behavior with increasing power dependence. As will be shown below, transient response to a large signal input current pulse train illustrates that the complementary common base configured transimpedance amplifier 64 can achieve superior output wave symmetry required for good (Bit Error Rate—a measure of signal transmission error) BER at high data rates.

Figure 11B:
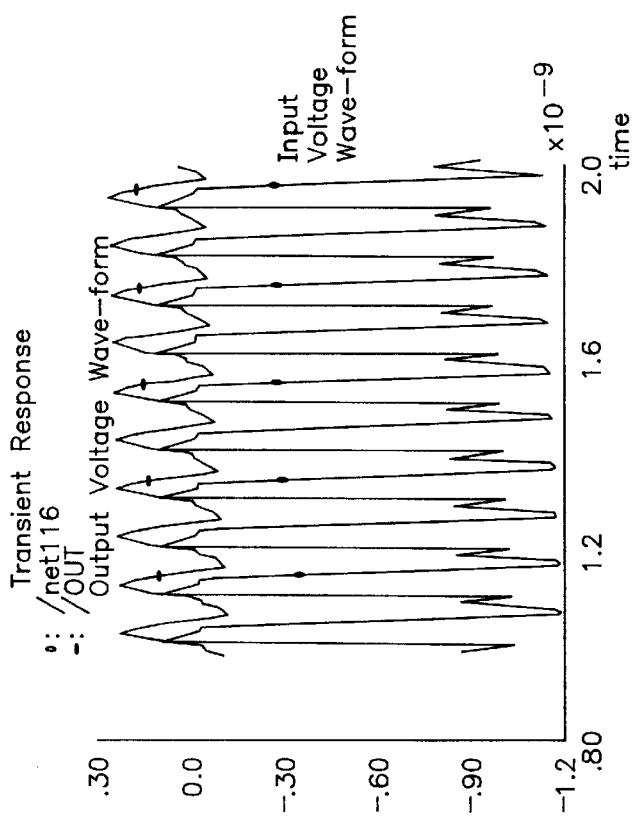
FIGS. 11a–11b illustrate the transient response of the transimpedance amplifier illustrated in FIG. 9 to a 10 GHz current pulse generator to increasing pulse amplitudes of 0.2 mA and 1.0 mA, respectively.
Figure 11A:
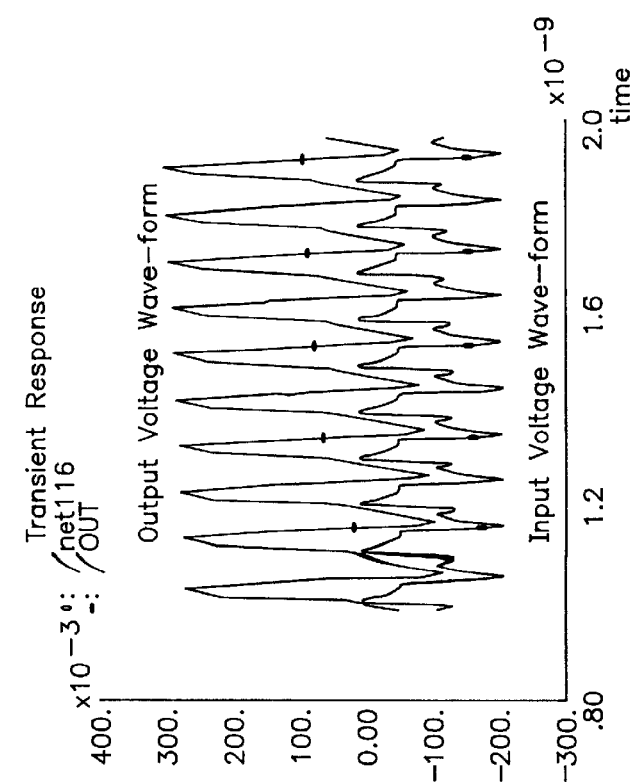

FIGS. 11a–11d illustrate the transient response of the complementary common-base configured input transimpedance amplifier 64 to a 10 GHz pulse generator for increasing pulse amplitudes of 0.2 mA, and 1.0 mA, respectively. At a low input current pulse amplitude of 0.2 mA, the input voltage resembles a square wave shape while the output waveform resembles an unsaturated sine wave shape as illustrated in FIG. 11a. As the input current pulse amplitude is increased to 1.0 mA, as illustrated in FIGS. 11b, the input voltage range begins to distort slightly. However, unlike the transimpedance amplifier with the common emitter configured input stage discussed above, the input voltage waveform does not exhibit any pronounced RC slewing on the falling or rising edge of the waveform. In fact, the input voltage waveforms have very abrupt rise and fall times indicative of fast signal transition due to the direct coupled complementary push pull input and output stages 76 and 80. Moreover, the symmetrical and unsaturated output waveforms exhibit well-defined rise and fall times as well as dwell time symmetry, unlike the single ended common base configured transimpedance amplifier discussed above, which provides a qualitative measurement of the BER resulting from the complementary common base configured input stage 76 as well as a complementary common collector configured push pull current output stage 80.

Figure 12:
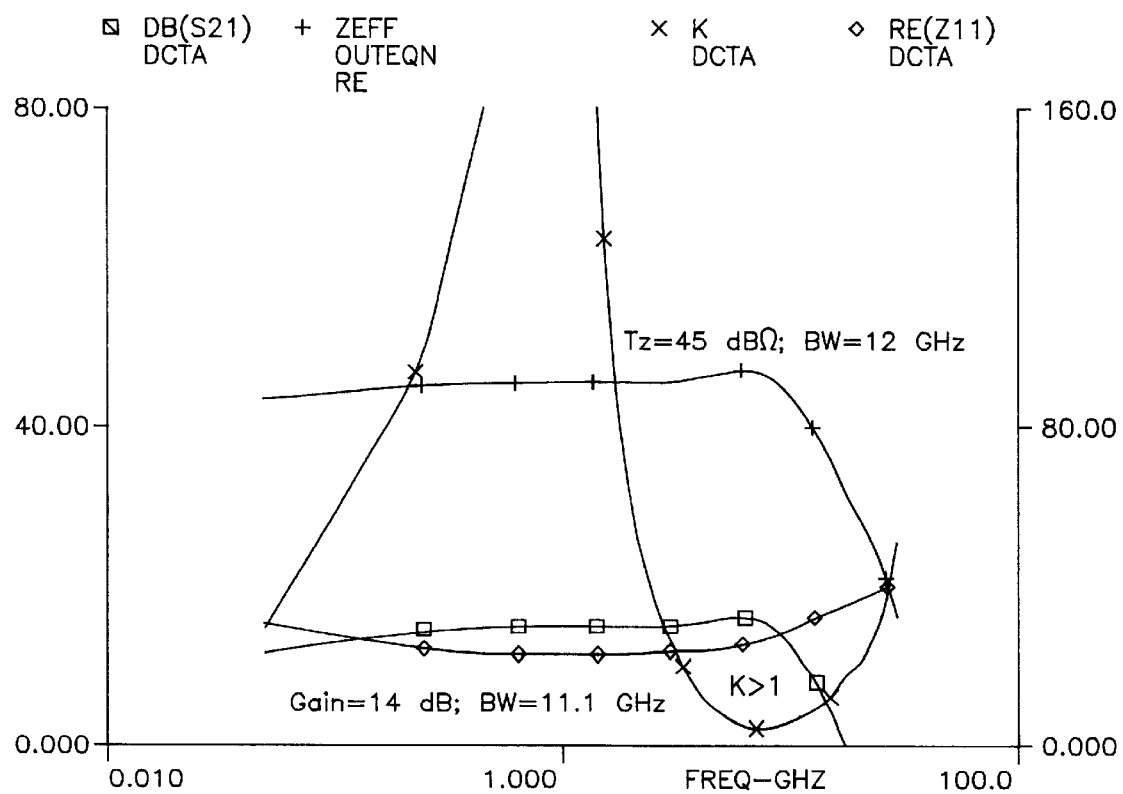
FIG. 12 is a graphical illustration illustrating the small signal transimpedance gain, 50 Ω power gain, input impedance, and 2-port stability factor K, as a function of frequency for the common base input transimpedance amplifier illustrated in FIG. 9.

FIG. 12 illustrates the small signal transimpedance gain, 50 Ω power gain, input impedance and 2 port stability factor K as a function of frequency for the transimpedance amplifier 64. A transimpedance of 45 dB Ω with a 12 GHz 3-db bandwidth can be achieved with the GaAs 1 μm emitter width (Self Aligned Base Ohmic Metal) SABM complementary PNP/NPN HBT technology with $f_T$ and $f_{max}$ of 43 GHz and 55 GHz, respectively, and a corresponding power gain of 14 dB with 11.1 GHz 3-dB bandwidth with unconditional stability.

In accordance with an important aspect of the invention, the balanced photoreceiver 62 can be fabricated with a complementary high speed bipolar process utilizing both PNP and NPN transistors. The photodetectors 66 and 68 are preferably fabricated from existing PNP or NPN device material structures, such as an InAlAs/InGaAs/InP based HBT technology. As such, the balanced photoreceiver 62 provides a relatively wide dynamic range and wideband balanced photoreceiver realized in compact low cost MMIC. However, it should be appreciated by those of ordinary skill of the art that an equivalent high performance balanced photoreceiver could be formed from hybrid form from several discrete MMIC's as well.

The balanced photoreceiver 62 in accordance with the present invention provides several advantages over known balanced photoreceiver topologies. For example, the balance photoreceiver 62 can operate over a frequency band from DC to millimeter wave which aids the BER performance for long data word length transmission in specific applications. Also, the balanced photoreceiver 62 can maintain wide bandwidth due to the immunity of the input impedance to changes in receipt input voltage power/current at the input of the preamplifier. This characteristic is critical since the input impedance of the preamplifier in combination with the affected photodetector off capacitance produces a dominant pole which determines the bandwidth performance of the receiver. If the input impedance of the amplifier increases substantially over a wide input power range, the effective bandwidth will change resulting in a degregation in the BER at the high data rate. Moreover, the push pull signal waveform is preserved from distortion with the complementary common base configured push pull input stage 76 of the transimpedance amplifier 64 which results in lower distortion as well as relatively more symmetric output waveform when driven by a strong current pulse train. The dynamic input impedance of the complementary common base configured input stage 76 is less sensitive to input power, voltage and current drive level than conventional single ended common emitter and common base configured transimpedance amplifier topologies and is less noisy than AC coupled matched voltage gain amplifiers in combination with a balance detector employing a 50 Ω DC shunt resistor for sinking and sourcing optically induced complementary photodiode currents. The ability of the transimpedance amplifier 64 to maintain low constant amplifier input impedance over a wide range of input power level allows the R-C input pole formed from the amplifiers input impedance and effective off capacitance of the photodiodes to remain constant thus preserving the dominant pole and corresponding bandwidth as well as the resulting BER under high data rates transmission.

Obviously, many modifications and variations of the present invention are possible in light of the above teachings. Thus, it is to be understood that, within the scope of the appended claims, the invention may be practiced otherwise than as specifically described above.

What is claimed and desired to be covered by a Letters Patent is as follows:

1. A photoreceiver for receiving optical signals and providing electrical output signals, the photoreceiver comprising:

one or more photodiodes for receiving optical signals and converting said optical signals to electrical signals; and a transimpedance amplifier, electrically coupled to said one or more photodiodes, said transimpedance amplifier including:

an input stage comprising two transistors connected in a complementary common base configuration;

an intermediate stage coupled to said input stage and comprising two transistors connected in a complementary common emitter configuration; and an output stage coupled to said intermediate stage and comprising two transistors connected in a complementary common collector configuration.

2. A transimpedance amplifier comprising:

an input stage which includes two transistors connected in a complementary common base configuration;

an intermediate stage coupled to the input stage and comprising two bipolar transistors connected in a complementary common emitter configuration; and an output stage coupled to the intermediate stage and comprising two transistors connected in a complementary common collector configuration.

* * * * *